United States Patent
Gorbold et al.

(10) Patent No.: US 11,835,584 B2
(45) Date of Patent: Dec. 5, 2023

(54) BATTERY SOH DETERMINATION CIRCUIT

(71) Applicant: Analog Devices International Unlimited Company, Limerick (IE)

(72) Inventors: Jeremy R. Gorbold, Newbury (GB); Paul Joseph Maher, Ennis (IE); Andreas Callanan, Murroe (IE)

(73) Assignee: Analog Devices International Unlimited Company, Limerick (IE)

( * ) Notice: Subject to any disclaimer, the term of this patent is extended or adjusted under 35 U.S.C. 154(b) by 537 days.

(21) Appl. No.: 16/997,624

(22) Filed: Aug. 19, 2020

(65) Prior Publication Data

US 2022/0057452 A1  Feb. 24, 2022

(51) Int. Cl.
*G01R 31/3842* (2019.01)
*G01R 31/28* (2006.01)
*G01R 31/3167* (2006.01)
*G01R 31/317* (2006.01)
*G01R 31/319* (2006.01)

(52) U.S. Cl.
CPC ..... *G01R 31/3842* (2019.01); *G01R 31/2874* (2013.01); *G01R 31/3167* (2013.01); *G01R 31/31725* (2013.01); *G01R 31/31926* (2013.01)

(58) Field of Classification Search
CPC ............ G01R 31/3842; G01R 31/2874; G01R 31/3167; G01R 31/31725; G01R 31/31926
USPC .......................................................... 702/63
See application file for complete search history.

(56) References Cited

U.S. PATENT DOCUMENTS

| 6,424,157 | B1 | 7/2002 | Gollomp et al. |
| 6,424,158 | B2 | 7/2002 | Klang |
| 7,619,390 | B2 | 11/2009 | Kim |
| 7,759,902 | B2 | 7/2010 | Gangsto et al. |
| 7,834,792 | B2 | 11/2010 | Sherry et al. |
| 9,234,943 | B2 | 1/2016 | Fabregas et al. |

(Continued)

FOREIGN PATENT DOCUMENTS

| CN | 106026341 A | 10/2016 |
| CN | 110641317 A | 1/2020 |

(Continued)

OTHER PUBLICATIONS

English translation of WO 2016/128230, Aug. 18, 2016. (Year: 2016).*

(Continued)

*Primary Examiner* — Michael P Nghiem
(74) *Attorney, Agent, or Firm* — Schwegman Lundberg & Woessner, P.A.

(57) ABSTRACT

A status of one or more components of a battery monitor circuit can be evaluated, such as to validate operation of the monitor circuit. In an example, a battery monitor circuit can be evaluated by providing a first test signal to a battery voltage measurement circuit that is coupled to a battery. A first analog-to-digital converter (ADC) circuit can be configured to receive a first voltage signal from the battery voltage measurement circuit in response to the first test signal. A processor circuit can be configured to validate the first ADC circuit by evaluating a correspondence between the first test signal and the received first voltage signal. One or more other ADC circuits in the battery monitor circuit can be validated by cross-checking measurement results with information from the first ADC circuit.

20 Claims, 5 Drawing Sheets

(56) References Cited

U.S. PATENT DOCUMENTS

| | | | |
|---|---|---|---|
| 9,638,762 B2 | 5/2017 | Scherr | |
| 10,359,449 B2 | 7/2019 | Callanan | |
| 10,429,450 B2 | 10/2019 | Lee et al. | |
| 2009/0121908 A1 | 5/2009 | Regier | |
| 2016/0069964 A1* | 3/2016 | Takahashi | H01M 10/44 324/433 |
| 2016/0259010 A1 | 9/2016 | Syouda | |
| 2017/0184682 A1 | 6/2017 | Lee et al. | |
| 2017/0232861 A1 | 8/2017 | Saito et al. | |
| 2020/0256924 A1 | 8/2020 | Hoermaier et al. | |
| 2020/0333376 A1* | 10/2020 | Graf | G01R 31/3842 |

FOREIGN PATENT DOCUMENTS

| | | |
|---|---|---|
| DE | 102017219016 | 4/2019 |
| EP | 2535729 A1 | 12/2012 |
| WO | WO-2013037307 A1 | 3/2013 |
| WO | 2016128230 | 8/2016 |
| WO | WO-2019245215 A1 | 12/2019 |

OTHER PUBLICATIONS

"Simplifying Current Sensing", Texas Instruments Inc., (2020), 58 pgs.

Li, Dale, "Current Shunt and Voltage Measurement Reference Design for EV/HEV Automotive Battery Monitoring", Texas Instruments Inc., (Oct. 2015), 36 pgs.

"International Application Serial No. PCT/EP2021/072433, International Search Report dated Nov. 26, 2021", 5 pgs.

"International Application Serial No. PCT/EP2021/072433, Written Opinion dated Nov. 26, 2021", 7 pgs.

"International Application Serial No. PCT/EP2021/072433, International Preliminary Report on Patentability dated Mar. 2, 2023", 9 pgs.

* cited by examiner

BATTERY SOH DETERMINATION CIRCUIT

BACKGROUND

Information about a battery state of health, state of charge, or operating status can be useful in various electrical systems that rely on battery power. For example, information about a battery or battery system status can be critical in vehicles where multiple systems depend on uninterrupted power from a battery. In an example, a battery system monitor can include an integrated solution with on-chip clock generation, sensors, processors, and measurement devices. The battery system monitor can include an analog subsystem with one or more ADC circuits and one or more programmable gain amplifiers (PGA) that can allow monitoring of various current and voltage ranges. In some examples, the analog subsystem can include one or more precision references on-chip.

Battery monitoring systems can be configured for voltage or current monitoring. In a shunt-based current measurement system, a current can be measured by inserting a known resistance "shunt" or shunt device in series with the current to be measured, such as a current from a battery, and then measuring a voltage drop across the series shunt device. Application of Ohm's Law (current (I)=voltage (V)/resistance (R)) can yield the current flowing through the shunt device. Accuracy of the current measurement can depend on the accuracy of the voltage measurement and the accuracy of the resistance of the shunt device itself.

In an example, a battery monitoring system can be factory calibrated, such as can include temperature compensation over a number of temperature points to allow for temperature effects on elements in the system. For automotive applications, a single temperature calibration is often used. However, over a lifetime of use of a shunt device, a resistive attenuation network, or other analog or digital components, values or component behavior can change in a manner that is independent of temperature or is otherwise unpredictable.

BRIEF SUMMARY

The present inventors have recognized, among other things, that a problem to be solved includes providing robust systems for evaluating battery state of health. In an example, a battery monitor circuit can comprise voltage measurement or current measurement portions. The problem can include determining whether information from the voltage and current measurement portions corresponds and is valid. In an example, the problem includes using respective ADC circuits in each of the voltage and current measurement portions and determining a validity or accuracy of information from the ADC circuits.

In an example, a solution to these and other problems can include or use an Intelligent Battery Sensing (IBS) system with a voltage measurement channel and a current measurement channel. In an example, the voltage measurement channel can include a digital-to-analog converter (DAC) circuit configured to provide a test signal to an attenuation network, and the attenuation network can be coupled to a battery to be monitored. A voltage signal can be measured from the attenuation network and information about the test signal can be extracted. The extracted information can be used to validate function of one or more components of the voltage measurement channel, including a first analog-to-digital converter (ADC) circuit. The validated first ADC circuit can be used in subsequent measurement and validation operations. For example, in the current measurement channel, information about a current in a shunt device can be measured using a second ADC circuit. In an example, the first ADC circuit, such as after being validated using the signal from the DAC circuit, can be configured to measure the same current in the shunt device. Information about correspondence or agreement between the shunt current values measured using the first and second ADC circuits can thus be used to validate operation of the second ADC circuit.

This Summary is intended to provide an overview of subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced. In the drawings, which are not necessarily drawn to scale, like numerals may describe similar components in different views. The drawings illustrate generally, by way of example, but not by way of limitation, various embodiments discussed in the present document.

DETAILED DESCRIPTION

Figure 1:
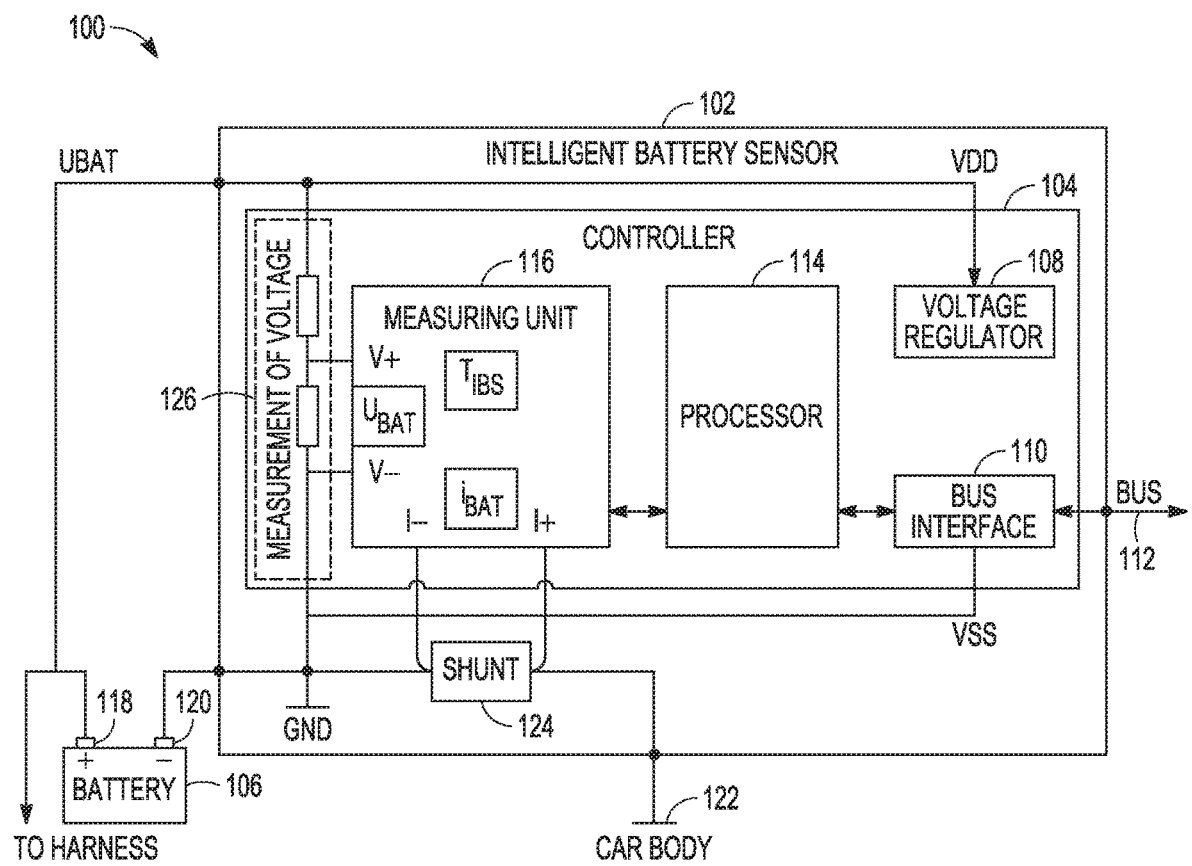
FIG. 1 illustrates generally an example of a battery system with an intelligent battery sensor.

In an Intelligent Battery Sensing (IBS) system for a battery, a state of health (SOH), a state of charge (SOC), or a state of function (SOF) of the battery can be monitored. In an example, the battery state information can be monitored in various modes of operation, including by measuring a battery voltage or a current provided by the battery. The current can be measured by placing a current shunt, or shunt device, in series with one of the battery terminals and then measuring a voltage drop across the shunt device. Application of Ohm's Law (current (I)=voltage (V)/resistance (R)) can be used to derive the current. For the current (I) measurement to be accurate, both the voltage (V) and resistance of the current shunt device (R) should be accurately known. In an example, a resistance of the shunt device can be measured at a point of manufacture, and then the shunt device can be offset or periodically calibrated.

Various techniques have been proposed for monitoring or determining a resistance of a shunt device in an IBS system, such as after it is deployed in the field. For example, Callahan, in U.S. Pat. No. 10,359,449, titled "Current Measurement Techniques to Compensate for Shunt Drift," which is hereby incorporated herein by reference in its entirety, describes a technique for introducing a known signal in sync with chop phases of a dual system chop scheme, chopping the known signal out in the main signal path, extracting the known signal in a parallel signal deprocessing path, and then using the extracted signal to determine a shunt device resistance characteristic.

It can be similarly important to verify the signal measurement or conversion chains in the IBS system. The IBS system can include, for example, one or more analog-to-digital converter (ADC) circuits, such as can be configured to measure voltage or current characteristics in the system. For example, an ADC circuit can be configured to measure a voltage across the shunt device and, in turn, the measured voltage can be used to determine an operating current received from the battery. Information received from the ADC circuit must therefore be accurate to obtain reliable information about the operating current from the battery. Accordingly there is a need to verify or check operation of an ADC circuit in an IBS system. In some examples, multiple parallel ADC circuit channels can be used and measurement results from the parallel circuit channels can be cross-checked for agreement.

In an example, an IBS system can include a voltage channel to measure a battery voltage. The channel can include, among other things, an attenuator, a buffer, and a sigma-delta ADC circuit, or first ADC circuit. Other types of ADC circuits can similarly be used. In an example, the same IBS system can include a current channel to measure a battery current, or a current load drawn from the battery, such as using an external shunt device. In an example, the current channel can include, among other things, a level shifter, an amplifier, a buffer, and a sigma-delta ADC circuit, or second ADC circuit. In an example, one or more multiplexer circuits can be provided in the voltage path to allow the same ADC circuits to measure other information, such as from other system sensors or devices.

In an example, the IBS system can include a digital-to-analog converter (DAC) circuit configured to provide a test signal, such as an AC or DC signal, between resistive elements of the attenuator in the voltage channel. In an example, the IBS system can include a switching circuit configured to switch (or shunt) one or more resistive elements of the attenuator in the voltage channel. The DAC circuit or the switching circuit can thus be used to modulate a signal in the voltage channel. Characteristics of the modulation can be known a priori or can be specified by a controller or processor circuit. Various components of a voltage signal measured using the first ADC circuit can be extracted by digital processing, such as to determine a main voltage component and modulated component that can include or indicate the modulation characteristics introduced by the test signal or switching circuit. In other words, the first ADC circuit can be used to measure the main voltage component without interruption. The modulated components can be analyzed or compared to the test signal, or to expected effects of the switching circuit. If the modulated components match to within specified tolerances, then the voltage channel, including the first ADC circuit, can be deemed operational or functioning appropriately. If the modulated components do not match within the specified tolerances, then a fault condition can exist in voltage channel. Various remedial actions can be taken, such as to remedy the fault, bypass the voltage channel, or take other action.

The current channel can similarly be tested or checked. In an example, the current channel can include or use a multiplexer circuit to present a shunt voltage signal to the first ADC circuit in the voltage channel. The same, or substantially the same, shunt voltage signal can be provided to the second ADC circuit in the current channel. If measurements from the first ADC circuit in the voltage channel and from the second. ADC circuit in the current channel agree, then the current channel can be deemed operational or functioning properly. That is, the first ADC circuit can be validated using the voltage channel, and then the validated first ADC can be used to validate the second ADC circuit using the current channel. In an example, the first and second ADC circuits can be different devices without shared resources and, in an example, can use independent references.

In another example, the IBS system can include or use a third ADC circuit to cross-check information from the voltage channel and information from the current channel. Operation of the third ADC circuit can be verified by comparing voltage measurement results with information from the voltage channel, and then using the validated third ADC circuit to cross-check information from the current channel. In an example, an IBS system that includes or uses the third ADC circuit can be less disruptive to voltage measurement timings of the main voltage path than systems that do not include the third ADC circuit.

FIG. 1 illustrates generally an example of a battery system 100 that includes an intelligent battery sensor 102. In the example of FIG. 1, the intelligent battery sensor 102 is shown in the context of an automotive application, however, the intelligent battery sensor 102 can be similarly used in other applications. In FIG. 1, the intelligent battery sensor 102 is coupled to a battery 106, such as a car or vehicle battery. The intelligent battery sensor 102 can include a controller 104, and the controller 104 can include, among other things, a voltage regulator 108, a bus interface 110, an IBS processor circuit 114, and a measuring unit 116. The bus interface 110 can be coupled to a data bus 112 to enable communication between the intelligent battery sensor 102 and other vehicle systems.

The IBS processor circuit 114 can include a general purpose or purpose-built processor. The IBS processor circuit 114 can be configured to control a measuring unit 116 of the intelligent battery sensor 102. In some examples, a memory controller can control access of the IBS processor circuit 114, such as to or from EEPROM Flash memory. In an example, the IBS processor circuit 114 includes circuitry that is partially or entirely external to the intelligent battery sensor 102 and is in data communication with the measuring unit 116.

In the example of FIG. 1, the intelligent battery sensor 102 can be coupled to the battery 106. For example, the measuring unit 116 can include, or can be coupled to, an attenuator network 126, and the attenuator network 126 can be coupled to the positive terminal 118 and the negative terminal 120 of the battery 106. The measuring unit 116 can thus receive information about a voltage $U_{BAT}$ of the battery 106 by measuring voltage information from the attenuator network 126. The polarity of the battery 106 or the polarity of the intelligent battery sensor 102 can optionally be reversed.

In a vehicle system, current from the battery 106 can be returned through a vehicle chassis or car body 122. A shunt device 124 can be coupled between the car body 122 and the battery 106 to thereby enable measurement of a current drawn from the battery 106. In an example, the shunt device 124 comprises a shunt resistor or resistive network. The measuring unit 116 can be coupled to receive information about a voltage across the shunt device 124. Using the measured voltage, the measuring unit 116 can determine a current $I_{BAT}$ through the shunt device 124. The information about the voltage of the battery 106 and the current in the shunt device 124 can be used to determine a state of health, state of charge, or other aspects of the battery 106.

As further described below, the measuring unit 116 can include or use a signal generator such as a DAC circuit to provide a known AC signal or DC signal to at least a portion of the attenuator network 126. Voltage signal characteristic information measured from the attenuator network 126 can be used together with characteristic information about the known signal to determine a health status or operational status of one or more aspects of the measuring unit 116 or the intelligent battery sensor 102. That is, information from the voltage signal characteristics can be used to validate one or more components of the measuring unit 116 or the intelligent battery sensor 102.

In an example, the measuring unit 116 includes or uses one or more analog-to-digital converter (ADC) circuits to receive analog voltage signals and convert such received signals into respective digital representations. The digital representations can be processed to identify various characteristics of the received signals. For example, a digital representation can include information about a magnitude, frequency, phase, or other aspect of a received analog voltage signal. The characteristic information recovered or extracted from a received signal can be used to validate or determine a health status of various circuitry, such as circuitry in the intelligent battery sensor 102. In an example, the measuring unit 116 can be configured to measure AC or DC information. For example, the measuring unit 116 can include a tuning circuit that can be used to extract an AC signal from a carrier signal as-received from a battery or one or more components coupled to the battery. In an example, the tuning circuit can be tuned using a modulation signal from the DAC circuit.

In an example where the DAC circuit provides a DC test signal, the measuring unit 116 can be configured to use a time-multiplexing test controller to intermittently stop or inhibit other battery measurements when a DC test signal is applied. In an example where the DAC circuit provides an AC test signal concurrently with conducting other battery measurements, the measuring unit 116 can be configured to use extraction means to separate out an AC response or test result signal from other battery measurements or signals.

In an example, a health status can include information about whether a component, network of components, system, or device is operational within specified tolerance limits. Health status information can include information about whether a circuit is accurately receiving, processing, or providing information. In an example, a health status of an ADC circuit can include information about whether the circuit is accurately timed or is producing digital signals that accurately correspond to respective analog input signals. In an example, if a health of an ADC circuit can be confirmed, then a confidence in information from the intelligent battery sensor 102 that includes the ADC circuit can be maintained. If, however, a health of an ADC cannot be confirmed or if the ADC circuit can be determined to be malfunctioning or faulty, then a confidence in information from the intelligent battery sensor 102 can be reduced and, in some examples, fault information can be generated such as to limit one or more aspects of a system relying on a battery sensed by the intelligent battery sensor 102.

Figure 2:
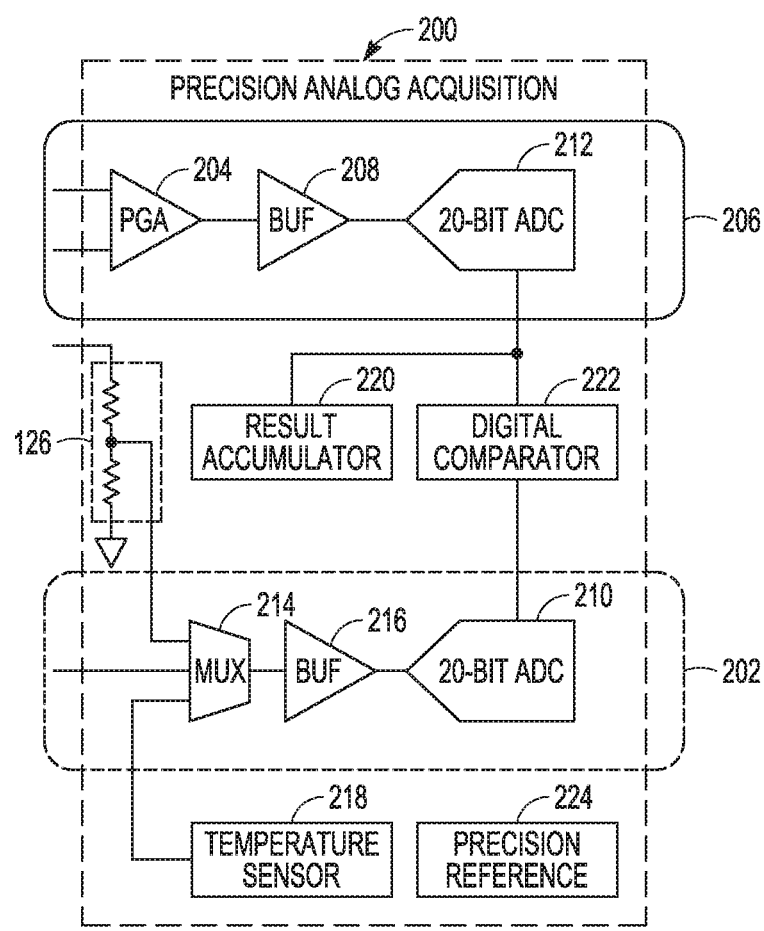
FIG. 2 illustrates generally an example of an acquisition stage in a battery system.

FIG. 2 illustrates generally an example of an acquisition stage 200 or front-end circuit portion of the measuring unit 116. In an example, the acquisition stage 200 can include a first voltage measurement circuit 202 and a first current measurement circuit 206. The first voltage measurement circuit 202 and first current measurement circuit 206 can be configured to measure, among other things, different operating aspects of the battery 106. For example, the first voltage measurement circuit 202 can be configured to measure voltage information about the battery 106, such as using the attenuator network 126, and the first current measurement circuit 206 can be configured to measure current or load information about the battery 106, such as using the shunt device 124. In an example, the acquisition stage 200 can be used together with various external conditioning circuitry, such as for buffering, isolating, or conditioning power and/or data signals. In an example, the conditioning circuitry can include or use components (e.g., resistors, capacitors, inductors, diodes, etc.) that are rated for an expected temperature range for a given application.

In the example of FIG. 2, the first voltage measurement circuit 202 can include a first multiplexer circuit 214, a first buffer circuit 216, and a first ADC circuit 210. The first multiplexer circuit 214 can be configured to couple the first ADC circuit 210 to various inputs or sources. For example, the first multiplexer circuit 214 can be configured to couple the first ADC circuit 210 to a temperature sensor 218, to the attenuator network 126, or to one or more other sources such that the first ADC circuit 210 can receive information from the respective sources in a time-multiplexed manner. In the example of FIG. 2, the first multiplexer circuit 214 can receive source information and provide it to the first ADC circuit 210 via the first buffer circuit 216. The first buffer circuit 216 can be configured to buffer or amplify signals received from the first multiplexer circuit 214 so as to present a gain-adjusted or impedance-matched signal at an input of the first ADC circuit 210.

In the example of FIG. 2, the first current measurement circuit 206 can include a current path programmable gain amplifier 204, a second buffer circuit 208, and a second ADC circuit 212. The current path programmable gain amplifier 204 can be coupled to the shunt device 124 to measure voltage information from the shunt device 124. In some examples, the first current measurement circuit 206 can include a level shifter, such as provided in the signal chain before the current path programmable gain amplifier 204, such as for shifting up the voltage potential below ground potential.

In an example, the temperature sensor 218 can include a sensor that is integrated with or is coupled to the acquisition stage 200. Information from the temperature sensor 218 can be used to determine a state of health, state of charge, or other information about a battery. The example acquisition stage 200 can include or use one or multiple instances of a precision reference circuit 224. The precision reference circuit 224 can be a device or reference source that can be used to calibrate various portions of the acquisition stage 200.

Figure 3:
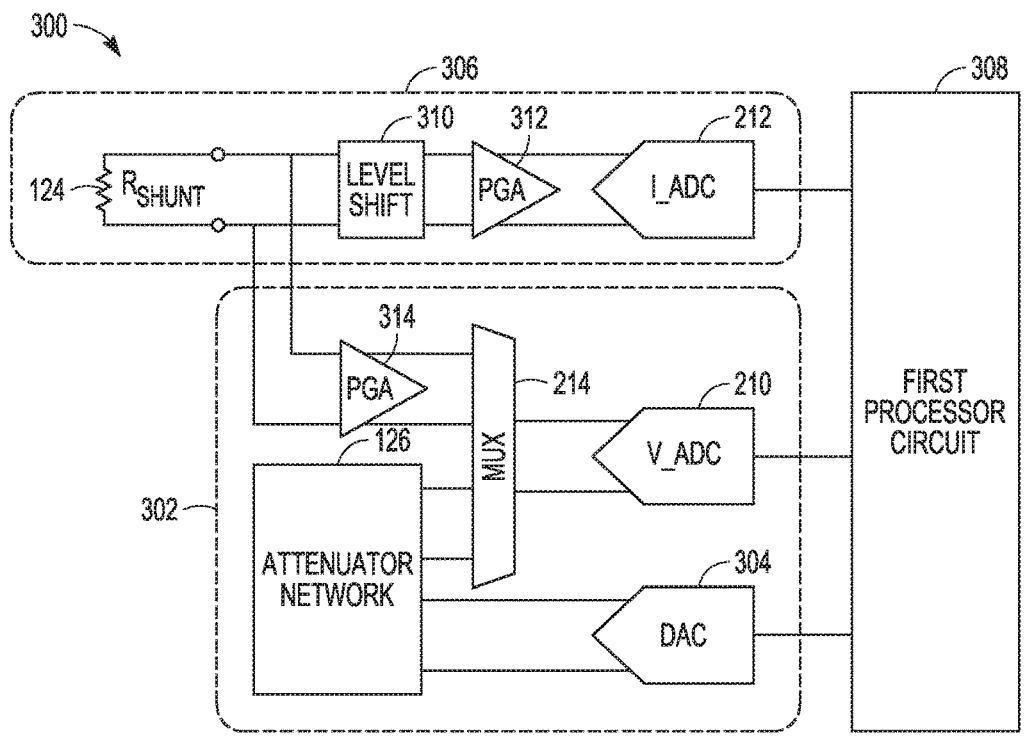
FIG. 3 illustrates generally an example of a first ADC monitor circuit.
Figure 4:
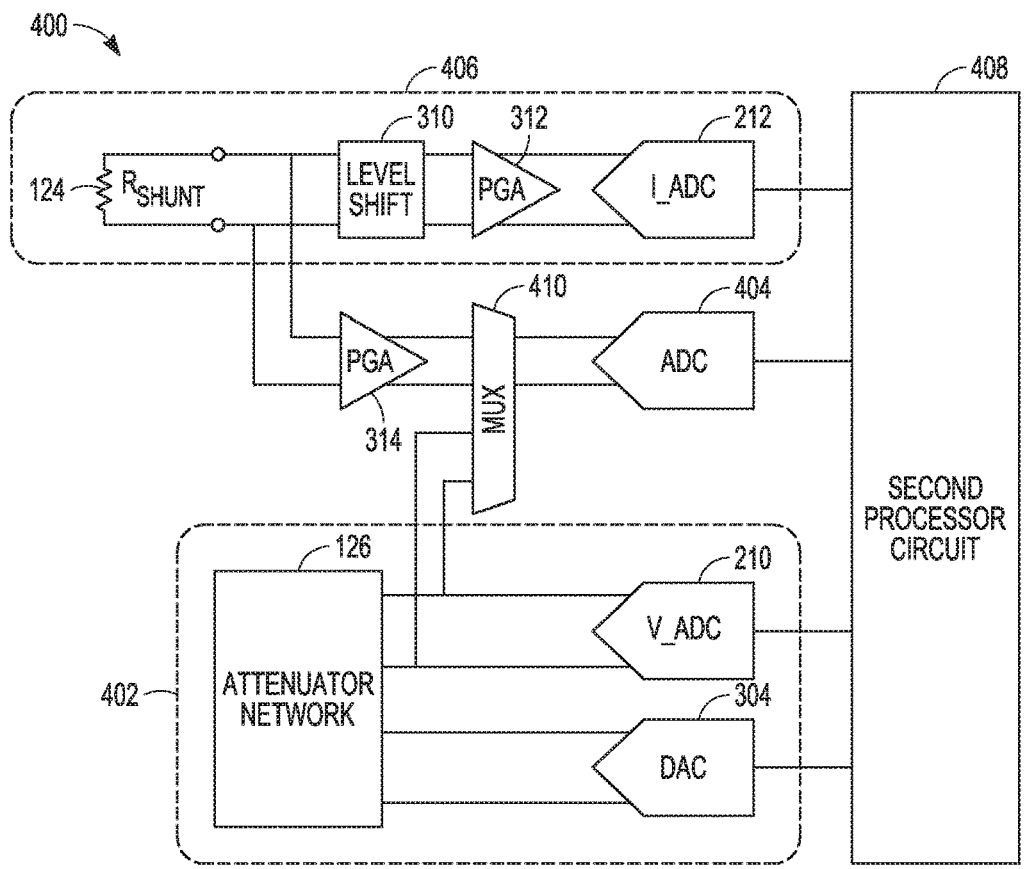
FIG. 4 illustrates generally an example of a second ADC monitor circuit.

FIG. 3 illustrates generally an example of a first ADC monitor circuit 300. The first ADC monitor circuit 300 can include a second voltage measurement circuit 302 that can include or comprise a portion of the first voltage measurement circuit 202 from the example of FIG. 2, and the first ADC monitor circuit 300 can include a second current measurement circuit 306 that can include or comprise a portion of the first current measurement circuit 206 from the example of FIG. 2. In the examples of FIG. 3 and FIG. 4, various buffer circuitry is omitted for ease of illustration. However, in practice, one or more of the ADC or DAC circuits can include buffer circuitry to help manage input or output signals. The first ADC monitor circuit 300 can include a first processor circuit 308, such as can include or comprise one or more of the comparator circuit 222 or the result accumulator circuit 220 from FIG. 2, or the IBS processor circuit 114 from FIG. 1. In an example, the first processor circuit 308 can be configured to control or monitor one or more aspects of the second voltage measurement circuit 302, the second current measurement circuit 306, or other portions of the acquisition stage 200 of an IBS.

In an example, the first processor circuit 308 can be used to determine or validate an operating status, or health status, of one or more components of the acquisition stage 200. For example, the first processor circuit 308 can be configured to validate an operating status of the first ADC circuit 210 in the second voltage measurement circuit 302, and the first processor circuit 308 can be configured to validate an operating status of the second ADC circuit 212 in the second current measurement circuit 306. In an example, the first processor circuit 308 can be configured to use information from the first ADC circuit 210 to validate an operating status of the second ADC circuit 212.

In the example of FIG. 3, the second voltage measurement circuit 302 includes the attenuator network 126 and a DAC circuit 304. The DAC circuit 304 can be responsive to control signals from the first processor circuit 308 to provide a test signal to one or more portions of the attenuator network 126. For example, the attenuator network 126 can include a resistive divider including at least first and second resistors. The DAC circuit 304 can be configured to provide an analog test signal across the first resistor in the attenuator network 126, such as in response to a command from the first processor circuit 308. In an example, the DAC circuit 304 can be used to control one or more shunt or short-circuit devices that are configured to short one or more of the resistors in the attenuator network 126 to thereby modulate a signal that can be measured from the attenuator network 126 using the first voltage measurement circuit 202.

The first multiplexer circuit 214 can be coupled to the attenuator network 126 and configured to receive a response voltage signal from one or more portions of the attenuator network 126. In an example, the first multiplexer circuit 214 is configured to sense the response voltage signal from the same resistor or same portion of the attenuator network 126 that receives the test signal from the DAC circuit 304. The response voltage signal can be provided as an analog input signal to the first ADC circuit 210 and, based on the response voltage signal, the first ADC circuit 210 can provide response voltage information about the attenuator network 126. For example, the first ADC circuit 210 can provide the response voltage information to the first processor circuit 308.

A problem to be solved includes determining whether information measured using the first ADC circuit 210 is valid. The present inventors have recognized, among other things, that a solution to the problem includes using information about the test signal provided by the DAC circuit 304 to the attenuator network 126 together with information measured using the first ADC circuit 210 from the attenuator network 126. In an example, the first processor circuit 308 can be configured to perform or coordinate the ADC circuit validation.

In an example, the first processor circuit 308 is configured to perform or coordinate diagnostics pursuant to ISO 26262, an international standard for functional safety of electrical and/or electronic systems in automobiles as defined by the International Organization for Standardization (ISO). For example, the first processor circuit 308, or one or more of the other processor circuits discussed herein, can be configured to detect individual failures, failures caused by external influences, timing failures, addressing failures, drift failures (for analogue signals), and/or transient failures in one or more automobile systems. The failure detection can include a comparison of various data outputs, sometimes referred to as monitored outputs, with independent data inputs to ensure compliance with a defined tolerance range (e.g., in terms of time, magnitude, value, or other characteristic).

The DAC circuit 304, such as under the control or direction of the first processor circuit 308, can be used to provide the test signal to the attenuator network 126, and the test signal can have characteristics that are known or defined by the first processor circuit 308. An effect of the test signal, such as having its known characteristics, on the attenuator network 126 and any signals measured therefrom can be known or understood in advance, such as under normal or abnormal operating conditions of one or more portions of the battery system 100. That is, an effect or influence of the test signal can be known when the battery 106 or when one or more aspects of the acquisition stage 200 is operating normally or abnormally. A characteristic of the response voltage signal, or response voltage information, can be monitored or analyzed by the first processor circuit 308 for correspondence or agreement with an expected effect of the test signal. In other words, information from the first ADC circuit 210 about a signal measured from the attenuator network 126 can be used together with information about a stimulus or test signal provided to the attenuator network 126 by the DAC circuit 304.

For example, the test signal from the DAC circuit 304 can include a DC signal, a pulse signal, or an AC signal, or a combination of such signals. In an example, the test signal can be configured to have a specified amplitude or non-zero frequency characteristic. A voltage signal received in response to the test signal, such as received by the first multiplexer circuit 214 and the first ADC circuit 210, can have substantially the same or corresponding amplitude and/or frequency characteristic as the test signal from the DAC circuit 304. The first processor circuit 308 can be configured to analyze the response voltage signal to determine whether it has the same or corresponding amplitude and/or frequency characteristic as that of the test signal. In an example, the effect of the test signal on the attenuator network 126 for a given operating status of the battery system 100 can be known and, accordingly, the first processor circuit 308 can be configured to analyze the response voltage signal to determine whether it has a characteristic corresponding to the known effect. A health status or function of one or more components of the first ADC monitor circuit 300 can thus be validated based on the correspondence as determined by the first processor circuit 308. For example, a health or function assessment of one or more of the first ADC circuit 210, the first multiplexer circuit 214, the attenuator network 126 can be provided based on the correspondence as determined by the first processor circuit 308. In an example, the health status or function information can include information about a validity of any correction, calibration, or control associated with one or more of the various components of the first ADC monitor circuit 300 or any external conditioning circuitry associated therewith.

If the first processor circuit 308 determines that the measured and expected signal components or characteristics do not match, such as to within specified tolerances, then the first processor circuit 308 can indicate a fault condition exists in the second voltage measurement circuit 302. If a fault condition is identified, then the first processor circuit 308 can be configured to take various remedial actions. The remedial actions can include, for example, operations to remedy the fault, to bypass the second voltage measurement circuit 302, to perform further diagnostics, or to perform other remedial action.

In the example of FIG. 3, the second current measurement circuit 306 includes the shunt device 124, a level shift circuit 310, a current channel amplifier circuit 312, and a second ADC circuit 212. The second ADC circuit 212 can be configured to measure voltage information from the shunt device 124, and the measured voltage information can be used (e.g., by the first processor circuit 308) to determine a current in the shunt device 124, such as by applying Ohm's law and using known information about a resistance of the shunt device 124. In an example, a shunt voltage signal from the shunt device 124 can be level-shifted using the level shift circuit 310 and/or can be gain-adjusted using the current channel amplifier circuit 312 before being provided to the second ADC circuit 212 for measurement.

A problem to be solved includes determining whether information measured using the second ADC circuit 212 is valid. The present inventors have recognized, among other things, that a solution to the problem includes using multiple ADC circuits in parallel to measure information, and then cross-checking the measurement results from the ADC circuits. In an example, the first processor circuit 308 can be configured to perform the ADC circuit validation, such as using information from the first ADC circuit 210 and the second ADC circuit 212 together.

In the example of FIG. 3, the voltage information from the shunt device 124 can be measured using the second ADC circuit 212 and using the first ADC circuit 210 in parallel. For example, the first multiplexer circuit 214 can be configured to connect input terminals of the first ADC circuit 210 to the attenuator network 126 or to the shunt device 124 in a time-interleaved manner. In other words, the first multiplexer circuit 214 can couple the first ADC circuit 210 to measure information from the attenuator network 126 during a first time interval, and the first multiplexer circuit 214 can couple the first ADC circuit 210 to measure information from the shunt device 124 during a second time interval. The first and second time intervals can be non-overlapping and, in an example, the first time interval can correspond to a time or interval when the DAC circuit 304 provides a test signal to the attenuator network 126. The second time interval can correspond to a time or interval when the second ADC circuit 212 receives information from the shunt device 124.

The first processor circuit 308 can receive the voltage information from the first ADC circuit 210 and the second ADC circuit 212. The first processor circuit 308 can be configured to compare the received voltage information to determine whether it is the same, such as to within a specified tolerance limit. If the received voltage information is sufficiently similar, then the first processor circuit 308 can be configured to determine a health status or function of the second ADC circuit 212. In other words, since a health status of the first ADC circuit 210 can be determined using the second voltage measurement circuit 302, subsequent measurements using the first ADC circuit 210 can be relied upon or can be deemed to be accurate. Therefore when the first ADC circuit 210 and the second ADC circuit 212 are used to measure information about substantially the same stimulus (e.g., a voltage across the shunt device 124) agreement between measurement results from the circuits can indicate that the second ADC circuit 212 is functioning properly.

If the first processor circuit 308 determines that the measured information from the first ADC circuit 210 and the second. ADC circuit 212 do not sufficiently agree, or are outside of a specified tolerance range, then the first processor circuit 308 can indicate a fault condition exists in the second current measurement circuit 306. If a fault condition is identified, then the first processor circuit 308 can be configured to take various remedial actions. The remedial actions can include, for example, operations to remedy the fault, to bypass the second current measurement circuit 306, to perform further diagnostics, or to perform other remedial action.

The example first ADC monitor circuit 300 of FIG. 3 can thus be used to validate operation of one or both of the first ADC circuit 210 and the second ADC circuit 212. A limitation of the first ADC monitor circuit 300 is that the first ADC circuit 210 can be occupied for a test duration that includes a first portion to measure a response voltage signal from the attenuator network 126, and a second portion to measure the shunt voltage from the shunt device 124. The first ADC circuit 210 can thus be unavailable for a duration of the ADC test period to perform other actions, such as monitoring the temperature sensor 218 or performing other measurements for the acquisition stage 200. The present inventors have recognized that a solution to this problem can include or use an additional ADC circuit to cross-check information from the second voltage measurement circuit 302 and the second current measurement circuit 306, such as using a second ADC monitor circuit 400.

FIG. 4 illustrates generally an example of a second ADC monitor circuit 400. The second ADC monitor circuit 400 can include a third voltage measurement circuit 402 that can include or comprise a portion of the second voltage measurement circuit 302 from the example of FIG. 3, and the second ADC monitor circuit 400 can include a third current measurement circuit 406 that can include or comprise a portion of the second current measurement circuit 306 from the example of FIG. 3. The second ADC monitor circuit 400 can include a second processor circuit 408, such as can include or comprise one or more of the comparator circuit 222 or the result accumulator circuit 220 from 2, or the IBS processor circuit 114 from FIG. 1. In an example, the second processor circuit 408 can be configured to control or monitor one or more aspects of the third voltage measurement circuit 402, the third current measurement circuit 406, or other portions of the acquisition stage 200 of an IBS.

In the example of FIG. 4, the second ADC monitor circuit 400 can include a third ADC circuit 404. The third ADC circuit 404 can be configured to measure information in parallel with the first ADC circuit 210 or the second ADC circuit 212. The measured information from the third ADC circuit 404 can be used to validate operation of at least the second ADC circuit 212.

The third voltage measurement circuit 402 can include the attenuator network 126 and the DAC circuit 304. The DAC circuit 304 can be controlled by signals from the second processor circuit 408 to thereby modulate a signal provided to, or to modulate signal behavior in, the attenuator network 126, as similarly described above in the discussion of FIG. 3. In the second ADC monitor circuit 400, the first ADC circuit 210 can be configured to read voltage information from the attenuator network 126. In an example, the first ADC circuit 210 can be coupled directly to the attenuator network 126 to read response voltage signals, such as in response to stimulus or test signals from the DAC circuit 304. In an example, a second multiplexer circuit 410 can be coupled in parallel with the first ADC circuit 210 to receive the response voltage signal from the attenuator network 126.

The third ADC circuit 404 can be coupled to the second multiplexer circuit 410. During first time intervals, the second multiplexer circuit 410 can provide voltage information from the attenuator network 126 to inputs of the third ADC circuit 404 such that the third ADC circuit 404 and the first ADC circuit 210 can receive substantially the same input signals.

A problem to be solved includes determining whether information measured using the first ADC circuit 210 is valid. The present inventors have recognized, among other things, that a solution to the problem includes using information about the test signal provided by the DAC circuit 304 to the attenuator network 126 together with information measured using the first ADC circuit 210 from the attenuator network 126. In an example, the second processor circuit 408 can be configured to perform or coordinate the ADC circuit validation.

The DAC circuit 304, such as under the control or direction of the second processor circuit 408, can be used to provide the test signal to the attenuator network 126, and the test signal can have characteristics that are known or defined by the second processor circuit 408. An effect of the test signal, such as having its known characteristics, on the attenuator network 126 and any signals measured therefrom can be known or understood in advance, such as under normal or abnormal operating conditions of one or more portions of the battery system 100. That is, an effect or influence of the test signal can be known when the battery 106 or when one or more aspects of the acquisition stage 200 is operating normally or abnormally. A characteristic of the response voltage signal, or response voltage information, can be monitored or analyzed by the second processor circuit 408 for correspondence or agreement with an expected effect of the test signal. In other words, information from the first ADC circuit 210 about a signal measured from the attenuator network 126 can be used together with or instead of information about a stimulus or test signal provided to the attenuator network 126 by the DAC circuit 304, as similarly described above in the example of FIG. 3.

For example, a test signal from the DAC circuit 304 can have a specified amplitude or frequency characteristic. The response voltage signal, such as received by the first ADC circuit 210, can have the same or corresponding amplitude and/or frequency characteristic. The second processor circuit 408 can be configured to analyze the response voltage signal to determine whether it has the same or corresponding amplitude and/or frequency characteristic as that of the test signal. In an example, the effect of the test signal on the attenuator network 126 for a given operating status of the battery system 100 can be known and, accordingly, the second processor circuit 408 can be configured to analyze the response voltage signal to determine whether it has a characteristic corresponding to the known effect. A status or function of the first ADC circuit 210 can thus be validated based on the correspondence as-determined by the second processor circuit 408.

The response voltage signal from the attenuator network 126 can be received via the second multiplexer circuit 410 at the third ADC circuit 404, such as substantially concurrently with the first ADC circuit 210. In other words, the first ADC circuit 210 and the third ADC circuit 404 can be configured to measure substantially the same voltage signal from the attenuator network 126 in response to the test signal from the DAC circuit 304. If measurements from the first ADC circuit 210 and the third ADC circuit 404 agree or sufficiently correspond, then a status or function of the third ADC circuit 404 can be validated.

In the example of FIG. 4, the third current measurement circuit 406 includes the shunt device 124, the level shift circuit 310, the current channel amplifier circuit 312, and the second ADC circuit 212. The second ADC circuit 212 can be configured to measure voltage information from the shunt device 124, and the measured voltage information can be used (e.g., by the second processor circuit 408) to determine a current in the shunt device 124, such as by applying Ohm's law and using known information about a resistance of the shunt device 124. In an example, a shunt voltage signal from the shunt device 124 can be level-shifted using the level shift circuit 310 and/or can be gain-adjusted using the current channel amplifier circuit 312 before being provided to the second ADC circuit 212 for measurement.

A problem to be solved includes determining whether information measured using the second ADC circuit 212 is valid. The present inventors have recognized, among other things, that a solution to the problem includes using multiple ADC circuits in parallel to measure information, and then cross-checking the measurement results from the ADC circuits. In an example, the second processor circuit 408 can be configured to perform the ADC circuit validation, such as using information from the third ADC circuit 404 and the second ADC circuit 212 together.

In the example of FIG. 4, the voltage information from the shunt device 124 can be measured using the second ADC circuit 212 and using the third ADC circuit 404 in parallel. For example, the second multiplexer circuit 410 can be configured to connect input terminals of the third ADC circuit 404 to the attenuator network 126 or to the shunt device 124 in a time-interleaved manner. In other words, the second multiplexer circuit 410 can couple the third ADC circuit 404 to measure information from the attenuator network 126 during a first time interval, and the second multiplexer circuit 410 can couple the third ADC circuit 404 to measure information from the shunt device 124 during a second time interval. The first and second time intervals can be non-overlapping and, in an example, the first time interval can correspond to a time or interval when the DAC circuit 304 provides a test signal to the attenuator network 126. The second time interval can correspond to a time or interval when the second ADC circuit 212 receives information from the shunt device 124.

The second processor circuit 408 can receive the voltage information from the third ADC circuit 404 and the second ADC circuit 212. The second processor circuit 408 can be configured to compare the received voltage information to determine whether it is the same, such as to within a specified tolerance limit. If the received voltage information is sufficiently similar, then the second processor circuit 408 can be configured to validate a health or function of the second ADC circuit 212. In other words, since a status of the third ADC circuit 404 can be determined or validated using a comparison of information received from the attenuator network 126 by the third ADC circuit 404 and by the first ADC circuit 210, subsequent measurements using the third ADC circuit 404 can be relied upon or can be deemed to be accurate. Therefore when the third ADC circuit 404 and the second ADC circuit 212 are used to measure information about substantially the same stimulus (e.g., a voltage across the shunt device 124) agreement between measurement results from the circuits can indicate that the second ADC circuit 212 is functioning properly.

If the second processor circuit 408 determines that the measured information from the third ADC circuit 404 and the second ADC circuit 212 do not sufficiently agree, or are outside of a specified tolerance range, then the second processor circuit 408 can indicate a fault condition exists in the third current measurement circuit 406. If a fault condition is identified, then the second processor circuit 408 can be configured to take various remedial actions. The remedial actions can include, for example, operations to remedy the fault, to bypass the third current measurement circuit 406, to perform further diagnostics, or to perform other remedial action.

An IRS system that includes or uses the second ADC monitor circuit 400 can thus use multiple ADC circuits to cross-check information from voltage and current channels to validate circuit operations. For example, operation of the third ADC circuit 404 can be verified by comparing voltage measurement results with information from the third voltage measurement circuit 402. The verified third ADC circuit 404 can then be used to cross-check information from the third current measurement circuit 406. In an example, an IBS system that includes or uses the second ADC monitor circuit 400, such as with the third ADC circuit 404, can be less disruptive to voltage measurement timings of the main voltage path than systems that do not include a third ADC circuit.

The examples of the first ADC monitor circuit 300 and the second ADC monitor circuit 400 are generally configured for using an AC stimulus signal from the DAC 304. However, in other embodiments, a DC stimulus signal, or an AC stimulus signal with a DC offset, can similarly be used. If a DC stimulus signal is used, then an unstimulated signal can be measured from the battery 106 (e.g., when the DAC 304 is off or provides a first test signal) as a reference value against which a test result can be compared.

Figure 5:
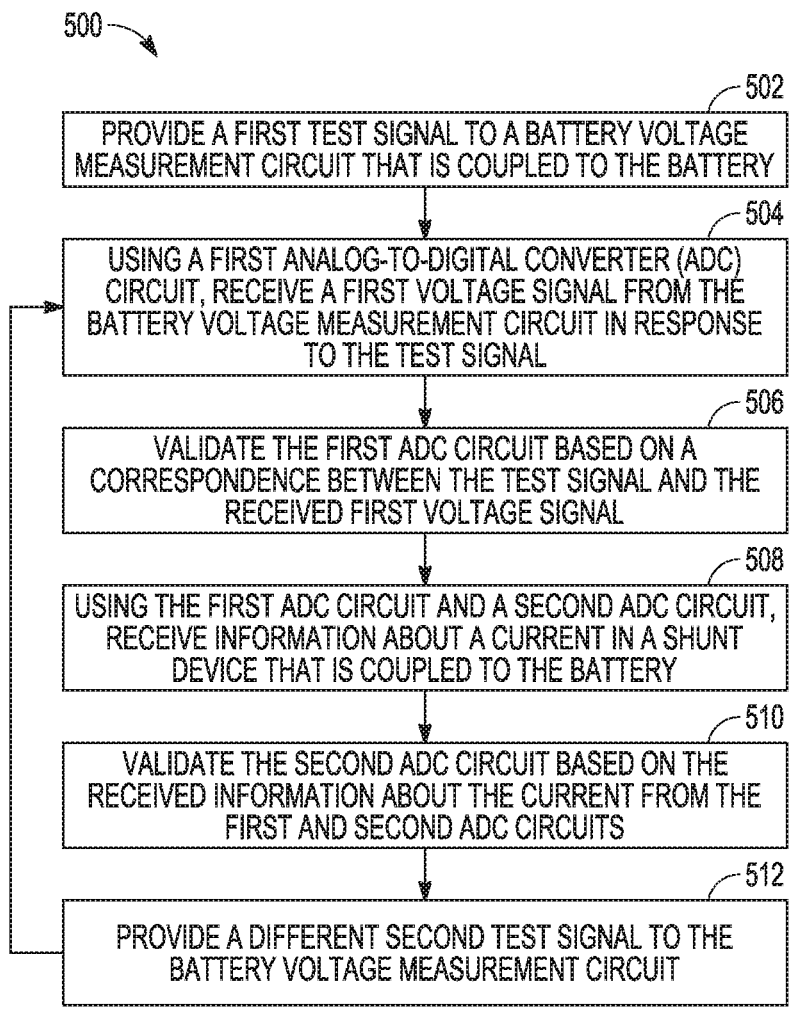
FIG. 5 illustrates generally a first method for validating operation of one or more ADC circuits.

FIG. 5 illustrates generally an example of a first method 500 for validating operation of one or more ADC circuits, such as using the battery system 100, the acquisition stage 200, the first ADC monitor circuit 300, or the second ADC monitor circuit 400. One or more aspects of the first method 500 can be performed by, or coordinated by, a processor circuit, such as the IBS processor circuit 114, the first processor circuit 308, or the second processor circuit 408.

At block 502, the first method 500 can include providing a first test signal to a battery voltage measurement circuit that is coupled to the battery. In an example, block 502 can include using the DAC circuit 304 to provide the first test signal to the attenuator network 126, and the attenuator network 126 comprises a portion of the battery voltage measurement circuit. A processor circuit can issue command or control signals to the DAC circuit 304 to provide the first test signal at designated times, and the first test signal can have characteristics (e.g., amplitude or frequency characteristics) that are known to the processor circuit.

At block 504, the first method 500 can include using a first analog-to-digital converter (ADC) circuit, such as the first ADC circuit 210, to receive a first voltage signal from the battery voltage measurement circuit in response to the first test signal. That is, block 504 can include receiving a first voltage signal from the attenuator network 126 in response to the first test signal provided by the DAC circuit 304.

At block 506, the first method 500 can include validating the first ADC circuit based on a correspondence between the first test signal and the received first voltage signal from the first ADC circuit. In an example, block 506 can include using a processor circuit to receive digital information from the first ADC circuit 210 about a response to the first test signal. The processor circuit that receives the digital information can, in an example, be the same processor circuit that provides the command or control signal to the DAC circuit 304 to provide the first test signal. The processor circuit can use the information about the first test signal together with the information measured by the first ADC circuit 210 to determine whether the first ADC circuit 210 is operating properly.

At block 508, the first method 500 can include using the first ADC circuit and a second ADC circuit, receiving information about a first current in a shunt device that is coupled to the battery. Block 508 can include using the first ADC circuit 210 and the second ADC circuit 212 to receive information about a current in the shunt device 124, such as by measuring a voltage across the shunt device 124 and using Ohm's law to calculate the current.

At block 510, the first method 500 can include validating the second ADC circuit based on the received information about the current in the shunt device 124 from the first and second ADC circuits. The processor circuit can be configured to receive or determine the current information based on signals from the first ADC circuit 210 and from the second ADC circuit 212. If the current information agrees, then the second ADC circuit 212 can be determined to be operational or functioning properly. For example, if the first ADC circuit 210 can be validated according to block 506, then subsequent information measured using the first ADC circuit 210 can be considered to be valid, or likely to be valid. Thus when the first ADC circuit 210 and the second ADC circuit 212 are used to measure the same stimulus signal or the same information about the shunt device 124, and the measured information from the respective ADC circuits agrees, then the second ADC circuit 212 can be considered to be operating properly.

At block 512, the first method 500 can include providing a different second test signal to the battery voltage measurement circuit that is coupled to the battery. In an example, block 512 can include using the DAC circuit 304 to provide the second test signal to the attenuator network 126. A processor circuit can issue command or control signals to the DAC circuit 304 to provide the second test signal at designated times, and the second test signal can have characteristics (e.g., amplitude or frequency characteristics) that are known to the processor circuit and can be different than one or more characteristics of the first test signal provided at block 502. In an example, values or characteristics of the first and second test signals can be specified such that different operating ranges of the ADC circuits can be tested or verified. Following block 512, the first method 500 can continue in a loop manner by returning to block 504. Further iterations of the loop, such as using different test signals, can similarly be carried out.

Figure 6:
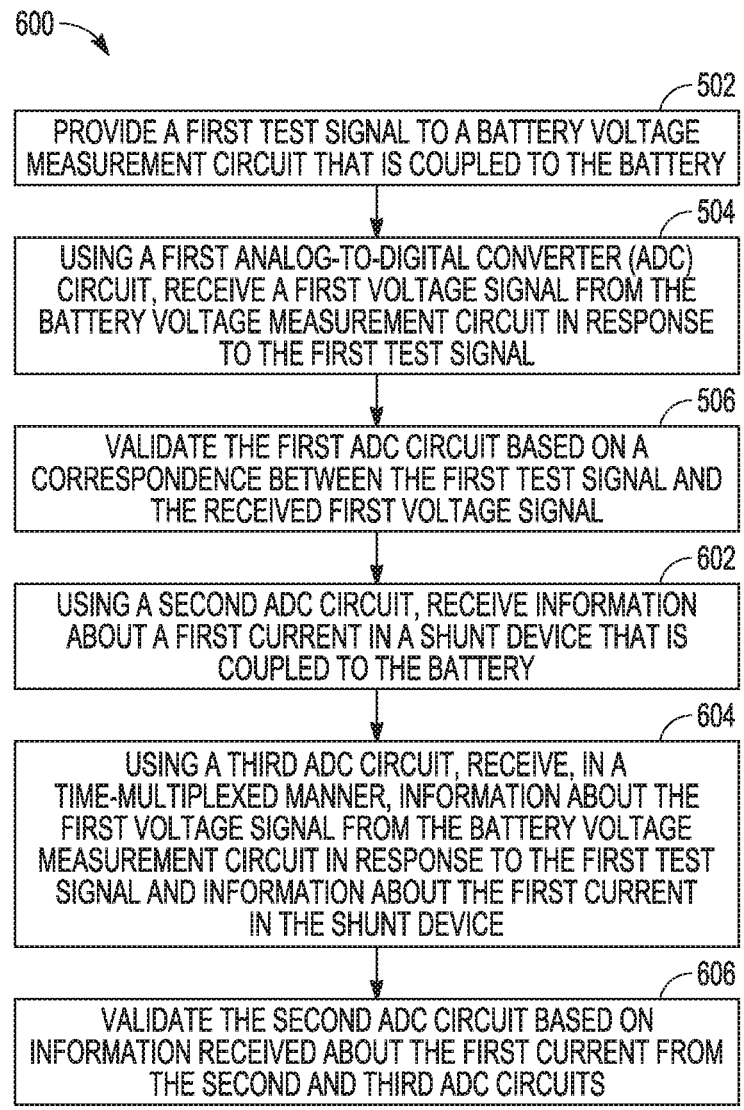
FIG. 6 illustrates generally a second method for validating operation of one or more ADC circuits.

FIG. 6 illustrates generally an example of a second method 600 for validating operation of one or more ADC circuits, such as using the battery system 100, the acquisition stage 200, the first ADC monitor circuit 300, or the second ADC monitor circuit 400. One or more aspects of the second method 600 can be performed by, or coordinated by, a processor circuit, such as the IBS processor circuit 114, the first processor circuit 308, or the second processor circuit 408. The second method 600 can include block 502, block 504, and block 506, which blocks are discussed above with respect to FIG. 5.

In the example of FIG. 6, block 602 can follow block 506. Block 602 can include using a second ADC circuit to receive information about current in a shunt device that is coupled to the battery. Block 602 can include using the second ADC circuit 212 to receive information about a current in the shunt device 124, such as by measuring a voltage across the shunt device 124 and using Ohm's law, or other function or means, to calculate the current.

At block 604, thee second method 600 can include using a third ADC circuit to receive information about the first voltage signal from the battery voltage measurement circuit in response to the first test signal, and to receive information about the first current in the shunt device. For example, block 604 can include using a multiplexer circuit, such as the second multiplexer circuit 410, to selectively couple the third ADC circuit 404 to the attenuator network 126 in the battery voltage measurement circuit during first time intervals, and to selectively couple the third ADC circuit 404 to the shunt device 124 during second time intervals. The first and second time intervals can be non-overlapping.

Using the second multiplexer circuit 410, the third ADC circuit 404 can be configured to receive information that can validate operation of the second ADC circuit 212. For example, if information from the third ADC circuit 404 agrees with information from first ADC circuit 210 during the first time intervals, then the third ADC circuit 404 can be determined to be functioning properly. If, during the second intervals, information from the third ADC circuit 404 agrees with information from the second ADC circuit 212 about a signal in the shunt device 124, then the second ADC circuit 212 can be determined to be functioning properly. Accordingly, at block 606, the second method 600 can include validating the second ADC circuit 212 based on information received about the first current in the shunt device 124.

Following block 606, the second method 600 can optionally include providing or using a second test signal, such as having one or more different characteristics than the first test signal, and then repeating the validation sequence. See, for example, the discussion of block 512 in the first method 500.

Various aspects of the present disclosure can help provide a solution to the test system-related problems identified herein. In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use an intelligent battery sensing system. In an example, Aspect 1 can include a method for determining a status of a battery monitor circuit for a first battery, such as using the intelligent battery sensing system. The method of Aspect 1 can include providing a first test signal to a battery voltage measurement circuit that is coupled to the battery, and using a first analog-to-digital converter (ADC) circuit, receiving a first voltage signal from the battery voltage measurement circuit in response to the first test signal. Aspect 1 can include validating the first ADC circuit based on a correspondence between the first test signal and the received first voltage signal.

Aspect 2 can include or use, or can optionally be combined with the subject matter of Aspect 1, to optionally include using the first ADC circuit and a second ADC circuit, receiving information about a first current in a shunt device that is coupled to the battery, and validating the second ADC circuit based on the received information about the first current from the first and second ADC circuits.

Aspect 3 can include or use, or can optionally be combined with the subject matter of Aspect 2, to optionally include receiving the information about the first current in the shunt device including using the first ADC circuit to measure a first magnitude characteristic of the first current in the shunt device and using the second ADC circuit to concurrently measure a second magnitude characteristic of the first current in the shunt device. Aspect 3 can include validating the second ADC circuit by comparing the first and second magnitude characteristics.

Aspect 4 can include or use, or can optionally be combined with the subject matter of Aspect 3, to optionally include using a multiplexer circuit, coupling the first ADC circuit to receive the first voltage signal from the battery voltage measurement circuit or to receive a second voltage signal from the shunt device, and the second voltage signal can indicate the first magnitude characteristic of the first current in the shunt device.

Aspect 5 can include or use, or can optionally be combined with the subject matter of one or any combination of Aspects 1 through 4 to optionally include providing the first test signal to the battery voltage measurement circuit by using a digital-to-analog converter (DAC) circuit to provide the first test signal.

Aspect 6 can include or use, or can optionally be combined with the subject matter of Aspect 5, to optionally include providing different reference signals to the DAC circuit and to the first ADC circuit.

Aspect 7 can include or use, or can optionally be combined with the subject matter of one or any combination of Aspects 5 or 6 to optionally include using a processor circuit for providing a control signal to the DAC circuit to instruct the DAC circuit to provide the first test signal, and validating the first ADC circuit based on a characteristic of the control signal provided to the DAC circuit and a characteristic of the first voltage signal received from the first ADC circuit.

Aspect 8 can include or use, or can optionally be combined with the subject matter of one or any combination of Aspects 1 through 7 to optionally include validating the first ADC circuit by comparing a frequency characteristic of the first test signal and a frequency characteristic of the first voltage signal received from the battery voltage measurement circuit.

Aspect 9 can include or use, or can optionally be combined with the subject matter of Aspect 1 to optionally include using a second ADC circuit for receiving information about a first current in a shunt device that is coupled to the battery, and using a third ADC circuit for receiving, in a time-multiplexed manner, (1) information about the first voltage signal from the battery voltage measurement circuit in response to the first test signal and (2) information about the first current in the shunt device. Aspect 9 can include validating the second ADC circuit based on information about the first current as-received from the second and third ADC circuits.

Aspect 10 can include or use, or can optionally be combined with the subject matter of one or any combination of Aspects 1 through 9 to optionally include providing the first test signal to the battery voltage measurement circuit by providing the first test signal to a first portion of a resistive voltage divider circuit in the battery monitor circuit.

Aspect 11 can include or use, or can optionally be combined with the subject matter of one or any combination of Aspects 1 through 10 to optionally include providing the first test signal to the battery voltage measurement circuit by providing a control signal to shunt one or more elements in a resistive voltage divider circuit in the battery monitor circuit.

Aspect 12 can include or use, or can optionally be combined with the subject matter of one or any combination of Aspects 1 through 11 to optionally include providing the first test signal by generating a signal that varies in frequency or amplitude over time, and validating the first ADC circuit can include using information about whether the first voltage signal includes changes in frequency or amplitude over time corresponding to respective changes in the first test signal.

Aspect 13 can include or use, or can optionally be combined with the subject matter of one or any combination of Aspects 1 through 12 to optionally include providing the first test signal to the battery voltage measurement circuit by providing the first test signal while the battery is under load.

Aspect 14 can include or use, or can optionally be combined with the subject matter of one or any combination of Aspects 1 through 13 to optionally include providing a DC reference signal to the battery voltage measurement circuit at a first time and, in response, receiving a reference result, wherein providing the first test signal includes providing the first test signal at a different second time, and wherein validating the first ADC circuit includes using the correspondence between the first test signal and the received first voltage signal and using the reference result.

Aspect 15 can include or use subject matter (such as an apparatus, a system, a device, a method, a means for performing acts, or a device readable medium including instructions that, when performed by the device, can cause the device to perform acts, or an article of manufacture), such as can include or use a system for a determining a health status of a battery monitor circuit for a battery. In Aspect 15, the system can comprise a first analog-to-digital converter (ADC) circuit configured to receive information about a voltage in a battery voltage measurement circuit, and a signal generator configured to provide a test signal to the battery voltage measurement circuit, and a processor circuit coupled to the first ADC circuit and the signal generator. In Aspect 15, the processor circuit can be configured to control the signal generator to provide the test signal to the battery voltage measurement circuit, and receive a digital signal from the first ADC circuit, the digital signal including information about the voltage in the battery voltage measurement circuit, and validate the first ADC circuit based on characteristics of the test signal and information in the digital signal about the voltage in the battery voltage measurement circuit.

Aspect 16 can include or use, or can optionally be combined with the subject matter of Aspect 15, to optionally include or use the signal generator comprising a digital-to-analog converter (DAC) circuit configured to receive a digital control signal from the processor circuit and, in response, provide the test signal to the battery voltage measurement circuit. Aspect 16 can include providing the test signal as an AC or DC test signal.

Aspect 17 can include or use, or can optionally be combined with the subject matter of one or any combination of Aspects 15 or 16 to optionally include or use the battery voltage measurement circuit, and the battery voltage measurement circuit includes a resistive attenuation network, and the signal generator is configured to provide the test signal to a first portion of the resistive attenuation network, and the first ADC circuit is configured to receive the information about the voltage in the battery voltage measurement circuit from the first portion of the resistive attenuation network.

Aspect 18 can include or use, or can optionally be combined with the subject matter of one or any combination of Aspects 15 through 17 to optionally include or use the processor circuit to validate the first ADC circuit based on magnitude or frequency information about the voltage in the battery voltage measurement circuit.

Aspect 19 can include or use, or can optionally be combined with the subject matter of one or any combination of Aspects 15 through 18 to optionally include or use a second ADC circuit configured to receive information about a first current in a shunt device that is coupled to the battery, and the processor circuit can be configured to determine a health status of the second ADC circuit based on the information about the first current in the shunt device received by the second ADC circuit and other information about current in the shunt device received by the first ADC circuit.

Aspect 20 can include or use, or can optionally be combined with the subject matter of Aspect 19, to optionally include or use a multiplexer circuit configured to couple the first ADC circuit to the shunt device or to the battery voltage measurement circuit.

Aspect 21 can include or use, or can optionally be combined with the subject matter of Aspect 15 to optionally include or use a second ADC circuit configured to receive information about a first current in a shunt device that is coupled to the battery, a multiplexer circuit, and a third ADC circuit, wherein the multiplexer circuit is configured to couple the third ADC circuit to the shunt device or to the battery voltage measurement circuit.

Aspect 22 can include or use, or can optionally be combined with the subject matter of Aspect 21, to optionally include the processor circuit configured to validate the second ADC circuit based on the information about the first current in the shunt device received by the second ADC and other information about current in the shunt device received by the third ADC circuit.

Aspect 23 can include or use subject matter (such as an apparatus, a system, a device, a method, a means for performing acts, or a device readable medium including instructions that, when performed by the device, can cause the device to perform acts, or an article of manufacture), such as can include a method for validating operation of a battery status monitor, wherein the battery status monitor includes a resistive attenuator network coupled to a battery. Aspect 23 can include using a signal generator, receiving a control signal from a processor circuit and, in response, providing a test signal to a first portion of the resistive attenuator network, and receiving, using a first analog-to-digital converter (ADC) circuit, first voltage information from the first portion of the resistive attenuator network in response to the test stimulus, and using the processor circuit, comparing the received first voltage information with information about the test signal to validate an operating status of the first ADC circuit. Aspect 23 can include receiving, using a second ADC circuit, second voltage information from a resistive shunt that is coupled to the battery, and receiving, using the first ADC circuit, third voltage information from the resistive shunt that is coupled to the battery, and using the processor circuit, comparing the second and third voltage information to validate an operating status of the second ADC circuit.

Aspect 24 can include or use, or can optionally be combined with the subject matter of Aspect 23, to optionally include using the first or second ADC circuit, receiving information from a sensor configured to monitor a temperature or functional status of the battery.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:
    using a signal generator, providing a first test signal to a battery voltage measurement circuit that is coupled to a battery;
    using a first analog-to-digital converter (ADC) circuit, receiving a first voltage signal from the battery voltage measurement circuit and providing a first output signal based on the first voltage signal from the battery voltage measurement circuit, wherein the first voltage signal is received by the first ADC circuit from the battery voltage measurement circuit in response to the first test signal: and
    using a processor circuit coupled to the first ADC circuit, validating the first ADC circuit based on a correspondence between a characteristic of the first test signal and information about the voltage in the battery voltage measurement circuit in the first output signal;
    wherein the processor circuit controls the signal generator to provide the first test signal.

2. The method of claim 1, further comprising:
    using the first ADC circuit and a second ADC circuit, receiving information about a first current in a shunt device that is coupled to the battery; and
    validating the second ADC circuit based on the received information about the first current from the first and second ADC circuits.

3. The method of claim 2, wherein receiving the information about the first current in the shunt device includes using the first ADC circuit to measure a first magnitude characteristic of the first current in the shunt device and using the second ADC circuit to concurrently measure a second magnitude characteristic of the first current in the shunt device; and
    wherein validating the second ADC circuit includes comparing the first and second magnitude characteristics.

4. The method of claim 3, further comprising using a multiplexer circuit, coupling the first ADC circuit to receive the first voltage signal from the battery voltage measurement circuit or to receive a second voltage signal from the shunt device, wherein the second voltage signal indicates the first magnitude characteristic of the first current in the shunt device.

5. The method of claim 1, wherein providing the first test signal to the battery voltage measurement circuit includes using a digital-to-analog converter (DAC) circuit to provide the first test signal.

6. The method of claim 5, further comprising using a processor circuit:
    providing a control signal to the DAC circuit to instruct the DAC circuit to provide the first test signal; and
    validating the first ADC circuit based on a characteristic of the control signal provided to the DAC circuit and a characteristic of the first output signal.

7. The method of claim 1, wherein validating the first ADC circuit includes comparing a frequency characteristic of the first test signal and a frequency characteristic of the first voltage signal received from the battery voltage measurement circuit.

8. The method of claim 1, further comprising:
    using a second ADC circuit, receiving information about a first current in a shunt device that is coupled to the battery;

using a third ADC circuit, receiving, in a time-multiplexed manner, (1) information about the first voltage signal from the battery voltage measurement circuit in response to the first test signal and (2) information about the first current in the shunt device; and validating the second ADC circuit based on information about the first current as-received from the second and third ADC circuits.

9. The method of claim 1, wherein providing the first test signal to the battery voltage measurement circuit includes providing the first test signal to a resistive voltage divider circuit.

10. The method of claim 1, wherein providing the first test signal to the battery voltage measurement circuit includes providing a control signal to shunt one or more resistors in a resistive voltage divider circuit.

11. The method of claim 1, wherein providing the first test signal includes generating a signal that varies in frequency or amplitude over time, and wherein validating the first ADC circuit includes using information about whether the first voltage signal includes changes in frequency or amplitude over time corresponding to respective changes in the first test signal.

12. The method of claim 1, farther comprising providing a DC reference signal to the battery voltage measurement circuit at a first time and, in response, receiving a reference result;

wherein providing the first test signal includes providing the first test signal at a different second time.

13. A system comprising:
a first analog-to-digital converter (ADC) circuit configured to receive information about a voltage in a battery voltage measurement circuit;
a signal generator configured to provide a test signal to the battery voltage measurement circuit; and
a processor circuit coupled to the first ADC circuit and the signal generator, the processor circuit configured to:
control the signal generator to provide the test signal to the battery voltage measurement circuit;
receive a digital signal from the first ADC circuit, the digital signal including information about the voltage in the battery voltage measurement circuit; and
validate the first ADC circuit based on characteristics of the test signal and information in the digital signal about the voltage in the battery voltage measurement circuit.

14. The system of claim 13, wherein the signal generator comprises a digital-to-analog converter (DAC) circuit configured to receive a digital control signal from the processor circuit and, in response, provide the test signal to the battery voltage measurement circuit.

15. The system of claim 13, further comprising the battery voltage measurement circuit, and the battery voltage measurement circuit includes a resistive attenuation network;
wherein the signal generator is configured to provide the test signal to the resistive attenuation network; and
wherein the first ADC circuit is configured to receive the information about the voltage in the battery voltage measurement circuit from the resistive attenuation network.

16. The system of claim 13, wherein the processor circuit is configured to validate the first ADC circuit based on magnitude or frequency information about the voltage in the battery voltage measurement circuit.

17. The system of claim 13, further comprising a second ADC circuit configured to receive information about a first current in a shunt device that is coupled to the battery;
wherein the processor circuit is configured to determine a health status of the second ADC circuit based on the information about the first current in the shunt device received by the second ADC circuit.

18. The system of claim 13, further comprising:
a second ADC circuit configured to receive information about a first current in a shunt device that is coupled to the battery;
a multiplexer circuit, and
a third ADC circuit;
wherein the multiplexer circuit is configured to couple the third ADC circuit to the shunt device or to the battery voltage measurement circuit; and
wherein the processor circuit is configured to validate the second ADC circuit using information about the first current in the shunt device received by the second ADC.

19. A method for validating operation of a battery status monitor, the battery status monitor including a resistive attenuator network coupled to a battery, the method comprising:
using a signal generator, receiving a control signal from a processor circuit and, in response, providing a test signal to the resistive attenuator network;
receiving, using a first analog-to-digital converter (ABC) circuit, first voltage information from the resistive attenuator network in response to the test signal, and providing, using the first ADC circuit, a first conversion result based on the first voltage information;
using the processor circuit, determining whether the first ADC circuit is operating properly using information about the first voltage information from the resistive attenuator network in the first conversion result and information about the test signal;
receiving, using a second ADC circuit, second voltage information from a resistive shunt that is coupled to the battery, and providing, using the second ADC circuit, a second conversion result based on the second voltage information;
receiving, using the first ADC circuit, third voltage information from the resistive shunt that is coupled to the battery, and providing, using the first ADC circuit, a third conversion result based on the third voltage information, and
using the processor circuit, comparing the second and third conversion results to validate an operating status of the second ADC circuit.

20. The method of claim 19, further comprising using the first or second ADC circuit, receiving information from a sensor configured to monitor a temperature or functional status of the battery.

* * * * *

UNITED STATES PATENT AND TRADEMARK OFFICE
CERTIFICATE OF CORRECTION

| | |
|---|---|
| PATENT NO. | : 11,835,584 B2 |
| APPLICATION NO. | : 16/997624 |
| DATED | : December 5, 2023 |
| INVENTOR(S) | : Gorbold et al. |

It is certified that error appears in the above-identified patent and that said Letters Patent is hereby corrected as shown below:

In the Claims

In Column 20, Line 17, in Claim 1, delete "signal:" and insert --signal;-- therefor In Column 21, Line 24, in Claim 12, delete "farther" and insert --further-- therefor In Column 22, Line 16, in Claim 18, delete "circuit," and insert --circuit;-- therefor In Column 22, Line 33, in Claim 19, delete "(ABC)" and insert --(ADC)-- therefor Signed and Sealed this
Fourth Day of February, 2025

Coke Morgan Stewart
*Acting Director of the United States Patent and Trademark Office*